(12) United States Patent
Lee et al.

(10) Patent No.: US 9,716,781 B2
(45) Date of Patent: Jul. 25, 2017

(54) MOBILE TERMINAL

(71) Applicant: LG ELECTRONICS INC., Seoul (KR)

(72) Inventors: Choonhwa Lee, Seoul (KR); Byungduck Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 71 days.

(21) Appl. No.: 14/648,777

(22) PCT Filed: Sep. 2, 2013

(86) PCT No.: PCT/KR2013/007886
§ 371 (c)(1),
(2) Date: Jun. 1, 2015

(87) PCT Pub. No.: WO2015/016418
PCT Pub. Date: Feb. 5, 2015

(65) Prior Publication Data
US 2015/0319275 A1    Nov. 5, 2015

(30) Foreign Application Priority Data

Jul. 29, 2013 (KR) .......................... 10-2013-0089778

(51) Int. Cl.
*H04M 1/00* (2006.01)
*H04M 1/02* (2006.01)
(Continued)

(52) U.S. Cl.
CPC .......... *H04M 1/0277* (2013.01); *H01H 13/02* (2013.01); *H01R 4/48* (2013.01);
(Continued)

(58) Field of Classification Search
CPC ........... H05K 3/365; H05K 2201/0999; H05K 9/0067; H04M 1/0274; H01R 12/62; H01R 4/48
(Continued)

(56) References Cited

U.S. PATENT DOCUMENTS

| 5,529,502 A | 6/1996 | Peltier et al. |
| 6,765,805 B2 * | 7/2004 | Naruse ...................... H01P 1/00 361/770 |

(Continued)

FOREIGN PATENT DOCUMENTS

| CN | 1484480 | 3/2004 |
| CN | 101110851 | 1/2008 |

(Continued)

OTHER PUBLICATIONS

PCT International Application No. PCT/KR2013/007886, Written Opinion of the International Searching Authority dated Apr. 7, 2014, 1 page.

(Continued)

*Primary Examiner* — William Nealon
(74) *Attorney, Agent, or Firm* — Lee, Hong, Degerman, Kang & Waimey

(57) ABSTRACT

A mobile terminal includes: a rib configured to protrude within a terminal body; and a connector installed in the rib and configured to electrically connect a printed circuit board (PCB) installed within the terminal body and a flexible printed circuit board (FPCB) supported by at least one side wall of the rib, wherein the connector includes: a housing formed of an insulating material and configured to include an accommodation portion covering the rib; and a terminal installed in the housing and including a first contact portion in contact with the FPCB accommodated within the accommodation portion and a second contact portion configured to (Continued)

be bent and extend from the first contact portion so as to be in contact with the PCB.

19 Claims, 11 Drawing Sheets

(51) Int. Cl.
| | |
|---|---|
| H01R 12/73 | (2011.01) |
| H01H 13/02 | (2006.01) |
| H05K 9/00 | (2006.01) |
| H01R 4/48 | (2006.01) |
| H01R 12/62 | (2011.01) |
| H01R 12/79 | (2011.01) |
| H05K 3/36 | (2006.01) |

(52) U.S. Cl.
CPC ............ *H01R 12/62* (2013.01); *H01R 12/73* (2013.01); *H01R 12/79* (2013.01); *H05K 9/0067* (2013.01); *H04M 1/0274* (2013.01); *H05K 3/365* (2013.01); *H05K 2201/0999* (2013.01)

(58) Field of Classification Search
USPC ...................................................... 455/575.1
See application file for complete search history.

(56) References Cited

U.S. PATENT DOCUMENTS

| | | | | |
|---|---|---|---|---|
| 2007/0264879 | A1* | 11/2007 | Simonsson ........ | H01R 4/4881 439/729 |
| 2008/0268713 | A1* | 10/2008 | Idzik ................. | H01R 4/02 439/629 |
| 2011/0111606 | A1* | 5/2011 | Lee ................... | H01R 12/613 439/62 |
| 2012/0268879 | A1* | 10/2012 | Kim .................. | H04M 1/0277 361/679.09 |
| 2013/0040505 | A1* | 2/2013 | Hirakawa .......... | H01R 12/721 439/733.1 |

FOREIGN PATENT DOCUMENTS

| | | |
|---|---|---|
| CN | 102761633 | 10/2012 |
| JP | 11-329623 | 11/1999 |
| KR | 10-2006-0099090 | 9/2006 |
| KR | 10-2012-0081650 | 7/2012 |

OTHER PUBLICATIONS

Chinese Patent Application No. 201380070406.0, Office Action dated Sep. 23, 2016, 5 pages.

\* cited by examiner

MOBILE TERMINAL

CROSS-REFERENCE TO RELATED APPLICATIONS

This application is the National Stage filing under 35 U.S.C. 371 of International Application No. PCT/KR2013/007886, filed on Sep. 2, 2013, which claims the benefit of earlier filing date and right of priority to Korean Application No. 10-2013-0089778, filed on Jul. 29, 2013, the contents of which are all hereby incorporated by reference herein in their entirety.

BACKGROUND OF THE INVENTION

1. Field of the Invention

The present disclosure relates to a connector configured to electrically connect a printed circuit board (PCB) and a flexible printed circuit board (FPCB) installed within a terminal body, and a mobile terminal including the connector.

2. Background of the Invention

In general, a terminal may be classified into a mobile (portable) terminal and a stationary terminal according to a moveable state. The mobile terminal may be also classified into a handheld terminal and a vehicle mount terminal according to a user's carriage method.

As functions of the terminal become more diversified, the terminal can support more complicated functions such as capturing images or video, reproducing music or video files, playing games, receiving broadcast signals, and the like. By comprehensively and collectively implementing such functions, the mobile terminal may be embodied in the form of a multimedia player or a device. In order to support and increase functions of terminals, improvement of structural parts and/or software parts of terminals may be taken into consideration.

In particular, research into high integration of electronic components within terminals and enhancement of durability of terminals in relation to structural parts of terminals have continued. Since numerous electronic components are installed within terminals, electrical disconnection between electronic components that may occur due to external impact or that may occur as the electronic components are used for a long period of time need to be prevented in order to enhance durability of terminals.

A PCB and an FPCB may be complexly installed and electrically connected within a terminal, and here, disposition of the FPCB to occupy a portion of the PCB may lead to a high possibility of reduction in a space for other components to be mounted on the PCB and electrical disconnection due to an impact applied from the outside and a drop (or a fall) of the terminal.

Thus, a terminal including a connector electrically connecting a PCB and an FPCB, preventing electrical disconnection, enhancing durability of the terminal, and securing an installation space of the PCB may be considered.

SUMMARY OF THE INVENTION

Therefore, an aspect of the detailed description is to provide a mobile terminal including a connector having a structure different from those of the related arts.

Another aspect of the detailed description is to provide a mobile terminal having enhanced durability.

Another aspect of the detailed description is to provide a mobile terminal including a connector which is able to form a ground (i.e., a connector which serves as a ground).

To achieve these and other advantages and in accordance with the purpose of this specification, as embodied and broadly described herein, a mobile terminal may include: a rib configured to protrude within a terminal body; and a connector installed in the rib and configured to electrically connect a printed circuit board (PCB) installed within the terminal body and a flexible printed circuit board (FPCB) supported by at least one side wall of the rib, wherein the connector includes: a housing formed of an insulating material and configured to include an accommodation portion covering the rib; and a terminal installed in the housing and configured to include a first contact portion in contact with the FPCB accommodated within the accommodation portion and a second contact portion configured to be bent and extend from the first contact portion so as to be in contact with the PCB.

According an example related to an exemplary embodiment of the present disclosure, the housing may include an installation portion in which the terminal is installed, and the installation portion may have a width corresponding to the terminal, and may have a step to prevent the terminal from being released.

The housing may include a cover portion covering at least a portion of the terminal installed in the installation portion in order to prevent the terminal from being released.

A portion of the terminal may be pressed by the PCB so as to be tightly attached to the installation portion.

According another example related to an exemplary embodiment of the present disclosure, the housing may include a through hole facing the FPCB accommodated in the accommodation portion, and the first contact portion may be provided to be inserted in the through hole and may be in contact with the FPCB through the through hole.

In order to tightly attach the FPCB to the rib, at least a portion of the first contact portion may protrude from the through hole to the accommodation portion to press the FPCB.

According another example related to an exemplary embodiment of the present disclosure, the terminal may protrude outwardly from the housing, and the second contact portion protrudes from an outwardly extending portion of the terminal so as to be in contact with the PCB disposed to be adjacent to the second contact portion.

According another example related to an exemplary embodiment of the present disclosure, the terminal may include a third contact portion formed between the first contact portion and the second contact portion and may be in contact with the PCB in a position different from that of the second contact portion.

The second contact portion and the third contact portion may be pressed by the PCB in order to prevent electrical disconnection with the PCB.

The third contact portion may protrude from the terminal and may be in contact with a side surface of the PCB.

The terminal may include a fourth contact portion formed in a portion covering the rib so as to have a step with respect to the first contact portion and the second contact portion.

The housing may include an installation portion in which the terminal is installed, the installation portion may have a width corresponding to the terminal, and may have a step to prevent the terminal from being released therefrom, and the fourth contact portion may protrude to be higher than the step of the installation portion.

The mobile terminal may further include: a conductive gasket configured to form a ground, disposed between the fourth contact portion and the terminal body, and electrically connected to the fourth contact portion.

The connector may be coupled to at least one different connector to form a connector module, and each housing of the connector module may include a coupling recess provided on one side thereof and a coupling protrusion provided on the other side and corresponding to the coupling recess, so as to be coupled to a different housing disposed to be adjacent to each other.

The connectors forming the connector module may be disposed side by side so as to be coupled to the rib extending in one direction.

According another example related to an exemplary embodiment of the present disclosure, the mobile terminal may further include: a key button disposed to be exposed outwardly from the terminal body; and a switch disposed within the terminal body such that the switch corresponds to the key button, and configured to generate an electrical signal according to a pressing operation of the key button, wherein the FPCB extends from the accommodation portion so as to be connected to the switch.

The connector may electrically connect the switch and the PCB.

According another example related to an exemplary embodiment of the present disclosure, the mobile terminal may further include a rigid flexible printed circuit board (RF PCB) accommodated in the accommodation portion and disposed to overlap the PCB in at least a portion thereof, wherein the connector may electrically connect the PCB and the RF PCB.

According another example related to an exemplary embodiment of the present disclosure, the terminal may be formed of a conductive stainless steel material.

The terminal body may be provided to cover the connector to fix the connector coupled to the rib.

According to exemplary embodiments of the present disclosure, since the connector is provided to be coupled to the rib within the terminal body, the connector may electrically connect the FPCB supported by the rib and the PCB disposed to be adjacent to the rib.

Also, according to exemplary embodiments of the present disclosure, since the connector is coupled to the rib and presses the FPCB or is pressed by the PCB, even though an external impact is applied thereto, electrical disconnection between connector and the FPCB or the PCB can be prevented.

In addition, according to exemplary embodiments of the present disclosure, since the connector forms a ground, as well as electrically connecting the PCB and the FPCB, electric shock damage (ESD) and electromagnetic interference (EMI) can be improved.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Hereinafter, the embodiments of the present invention will be described with reference to the accompanying drawings, in which like numbers refer to like elements throughout although the embodiments are different, and a description of the like elements a first embodiment will be used for those of the different embodiment. Also, as used herein, singular forms "a", "an" and "the" are intended to include the plural forms as well, unless the context clearly indicates otherwise. In the following description, usage of suffixes such as 'module', 'part' or 'unit' used for referring to elements is given merely to facilitate explanation of the present invention, without having any significant meaning by itself.

The embodiments of the present invention will now be described with reference to the accompanying drawings, in which like numbers refer to like elements throughout although the embodiments are different, and a description of the like elements a first embodiment will be used for those of the different embodiment. In the following description, usage of suffixes such as 'module', 'part' or 'unit' used for referring to elements is given merely to facilitate explanation of the present invention, without having any significant meaning by itself. In describing the present invention, if a detailed explanation for a related known function or construction is considered to unnecessarily divert the gist of the present invention, such explanation has been omitted but would be understood by those skilled in the art. The accompanying drawings of the present invention aim to facilitate understanding of the present invention and should not be construed as limited to the accompanying drawings.

Mobile terminals described in the present disclosure may include mobile phones, smart phones, notebook computers, tablet computers, digital broadcast receivers, PDAs (Personal Digital Assistants), PMPs (Portable Multimedia Player), navigation devices, slate PCs, tablet PCs, ultrabooks, and the like. However, it would be understood by a person skilled in the art that the configuration according to embodiments of the present invention can be also applicable to the fixed types of terminals such as digital TVs, desk top computers, and the like, except for any elements especially configured for a mobile purpose.

Figure 1:
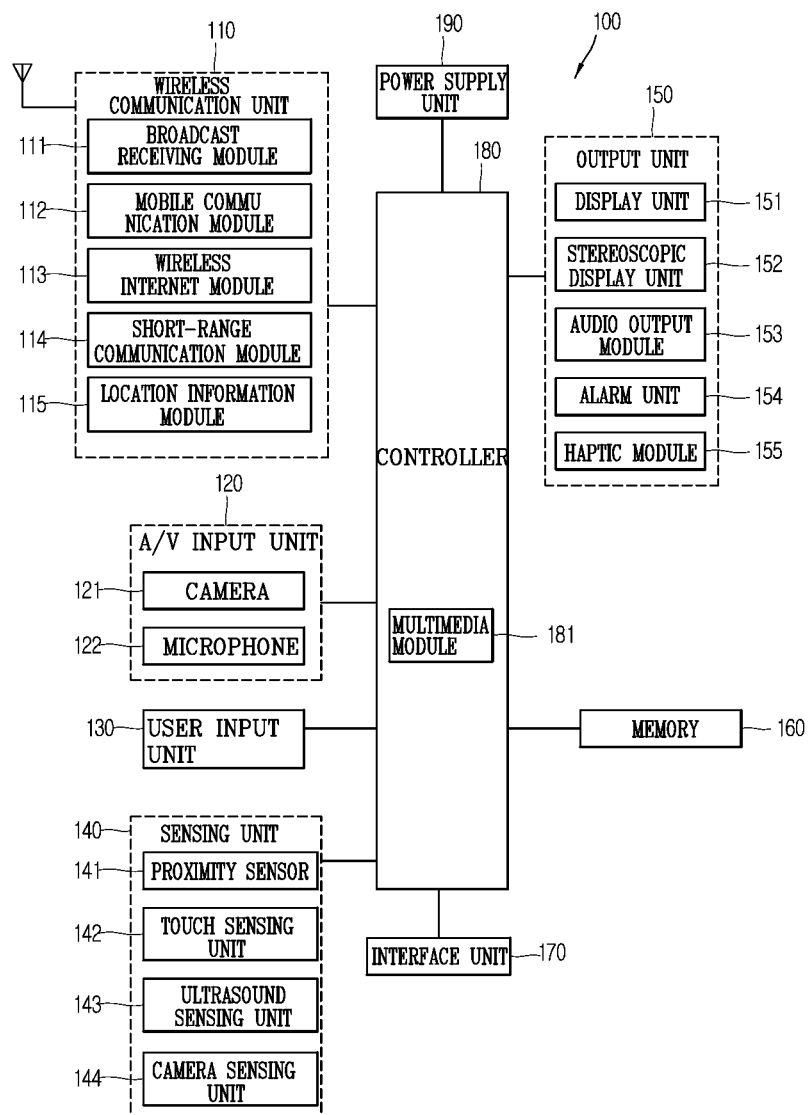
FIG. 1 is a block diagram of a mobile terminal related to an exemplary embodiment of the present disclosure.

FIG. 1 is a block diagram of a mobile terminal according to an embodiment of the present invention.

The mobile terminal 100 may include a wireless communication unit 110, an A/V (Audio/Video) input unit 120, a user input unit 130, a sensing unit 140, an output unit 150, a memory 160, an interface unit 170, a controller 180, and a power supply unit 190, etc. FIG. 1 shows the mobile terminal as having various components, but it should be understood that implementing all of the illustrated components is not a requirement. Greater or fewer components may alternatively be implemented.

The elements of the mobile terminal will be described in detail as follows.

The wireless communication unit 110 typically includes one or more modules allowing radio communication between the mobile terminal 100 and a wireless communication system or a network in which the mobile terminal is located. For example, the wireless communication unit may include at least one of a broadcast receiving module 111, a mobile communication module 112, a wireless Internet module 113, a short-range communication module 114, and a location information module 115.

The broadcast receiving module 111 receives broadcast signals and/or broadcast associated information from an external broadcast management server (or other network entity) via a broadcast channel.

The broadcast channel may include a satellite channel and/or a terrestrial channel. The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal combined with a TV or radio broadcast signal.

The broadcast associated information may refer to information associated with a broadcast channel, a broadcast program or a broadcast service provider. The broadcast associated information may also be provided via a mobile communication network and, in this case, the broadcast associated information may be received by the mobile communication module 112.

The broadcast associated information may exist in various forms. For example, it may exist in the form of an electronic program guide (EPG) of digital multimedia broadcasting (DMB), electronic service guide (ESG) of digital video broadcast-handheld (DVB-H), and the like.

The broadcast receiving module 111 may be configured to receive signals broadcast by using various types of broadcast systems. In particular, the broadcast receiving module 111 may receive a digital broadcast by using a digital broadcast system such as multimedia broadcasting-terrestrial (DMB-T), digital multimedia broadcasting-satellite (DMB-S), digital video broadcast-handheld (DVB-H), the data broadcasting system known as media forward link only (MediaFLO®), integrated services digital broadcast-terrestrial (ISDB-T), etc. The broadcast receiving module 111 may be configured to be suitable for every broadcast system that provides a broadcast signal as well as the above-mentioned digital broadcast systems.

Broadcast signals and/or broadcast-associated information received via the broadcast receiving module 111 may be stored in the memory 160.

The mobile communication module 112 transmits and/or receives radio signals to and/or from at least one of a base station, an external terminal and a server. Such radio signals may include a voice call signal, a video call signal or various types of data according to text and/or multimedia message transmission and/or reception.

The mobile communication module 112 may implement a video call mode and a voice call mode. The video call mode indicates a state of calling with watching a callee's image. The voice call mode indicates a state of calling without watching the callee's image. The wireless communication module 112 may transmit and receive at least one of voice and image in order to implement the video call mode and the voice call mode.

The wireless Internet module 113 supports wireless Internet access for the mobile terminal. This module may be internally or externally coupled to the terminal. The wireless Internet access technique implemented may include a WLAN (Wireless LAN) (Wi-Fi), Wibro (Wireless broadband), Wimax (World Interoperability for Microwave Access), HSDPA (High Speed Downlink Packet Access), or the like.

The short-range communication module 114 is a module for supporting short range communications. Some examples of short-range communication technology include Bluetooth™, Radio Frequency IDentification (RFID), Infrared Data Association (IrDA), Ultra-WideBand (UWB), ZigBee™, and the like.

The location information module 115 is a module for checking or acquiring a location (or position) of the mobile terminal. A typical example of the location information module is a GPS (Global Positioning System) or a WiFi (Wireless Fidelity) module.

With reference to FIG. 1, the A/V input unit 120 is configured to receive an audio or video signal. The A/V input unit 120 may include a camera 121 and a microphone 122. The camera 121 processes image data of still pictures or video obtained by an image capture device in a video capturing mode or an image capturing mode. The processed image frames may be displayed on a display unit 151.

The image frames processed by the camera 121 may be stored in the memory 160 (or other storage medium) or transmitted via the wireless communication unit 110. Two or more cameras 121 may be provided according to the configuration of the mobile terminal.

The microphone 122 may receive sounds (audible data) via a microphone in a phone call mode, a recording mode, a voice recognition mode, and the like, and can process such sounds into audio data. The processed audio (voice) data may be converted for output into a format transmittable to a mobile communication base station via the mobile communication module 112 in case of the phone call mode. The microphone 122 may implement various types of noise canceling (or suppression) algorithms to cancel (or suppress) noise or interference generated in the course of receiving and transmitting audio signals.

The user input unit 130 may generate input data from commands entered by a user to control various operations of the mobile terminal. The user input unit 130 may include a keypad, a dome switch, a touch pad, a jog wheel, a jog switch, and the like.

The sensing unit 140 detects a current status (or state) of the mobile terminal 100 such as an opened or closed state of the mobile terminal 100, a location of the mobile terminal 100, the presence or absence of user contact with the mobile terminal 100 (i.e., touch inputs), the orientation of the mobile terminal 100, an acceleration or deceleration movement and direction of the mobile terminal 100, etc., and generates commands or signals for controlling the operation of the mobile terminal 100. For example, when the mobile terminal 100 is implemented as a slide type mobile phone, the sensing unit 140 may sense whether the slide phone is opened or closed. In addition, the sensing unit 140 can detect whether or not the power supply unit 190 supplies power or whether or not the interface unit 170 is coupled with an external device.

The output unit 150 is configured to provide outputs in a visual, audible, and/or tactile manner (e.g., audio signal, video signal, alarm signal, vibration signal, etc.). The output unit 150 may include the display unit 151, an audio output module 153, an alarm unit 154, a haptic module 155, and the like.

The display unit 151 may display (output) information processed in the mobile terminal 100. For example, when the mobile terminal 100 is in a phone call mode, the display unit 151 may display a User Interface (UI) or a Graphic User Interface (GUI) associated with a call or other communication (such as text messaging, multimedia file downloading, etc.). When the mobile terminal 100 is in a video call mode or image capturing mode, the display unit 151 may display a captured image and/or received image, a UI or GUI that shows videos or images and functions related thereto, and the like.

The display unit 151 may include at least one of a Liquid Crystal Display (LCD), a Thin Film Transistor-LCD (TFT-LCD), an Organic Light Emitting Diode (OLED) display, a flexible display, a three-dimensional (3D) display, and an e-ink display.

Some of them may be configured to be transparent or light-transmissive to allow viewing of the exterior, which may be called transparent displays. A typical transparent display may be, for example, a TOLED (Transparent Organic Light Emitting Diode) display, or the like. Through such configuration, the user can view an object positioned at the rear side of the terminal body through the region occupied by the display unit 151 of the terminal body.

The mobile terminal 100 may include two or more display units according to its particular desired embodiment. For example, a plurality of display units may be separately or integrally disposed on one surface of the mobile terminal, or may be separately disposed on mutually different surfaces.

Also, the display unit 151 may be configured as a stereoscopic display unit 152 displaying a stereoscopic image.

Here, the stereoscopic image may be a three-dimensional (3D) stereoscopic image, and the 3D stereoscopic image is an image refers to an image making a viewer feel that a gradual depth and reality of an object on a monitor or a screen is the same as a reality space. A 3D stereoscopic image is implemented by using binocular disparity. Binocular disparity refers to disparity made by the positions of two eyes. When two eyes view different 2D images, the images are transferred to the brain through the retina and combined in the brain to provide the perception of depth and reality sense.

The stereoscopic display unit 152 may employ a stereoscopic display scheme such as stereoscopic scheme (a glass scheme), an auto-stereoscopic scheme (glassless scheme), a projection scheme (holographic scheme), or the like. Stereoscopic schemes commonly used for home television receivers, or the like, include Wheatstone stereoscopic scheme, or the like.

The auto-stereoscopic scheme includes, for example, a parallax barrier scheme, a lenticular scheme, an integral imaging scheme, or the like. The projection scheme includes a reflective holographic scheme, a transmissive holographic scheme, or the like.

In general, a 3D stereoscopic image is comprised of a left image (a left eye image) and a right image (a right eye image). According to how left and right images are combined into a 3D stereoscopic image, the 3D stereoscopic imaging method is divided into a top-down method in which left and right images are disposed up and down in a frame, an L-to-R (left-to-right, side by side) method in which left and right images are disposed left and right in a frame, a checker board method in which fragments of left and right images are disposed in a tile form, an interlaced method in which left and right images are alternately disposed by columns and rows, and a time sequential (or frame by frame) method in which left and right images are alternately displayed by time.

Also, as for a 3D thumbnail image, a left image thumbnail and a right image thumbnail are generated from a left image and a right image of the original image frame, respectively, and then combined to generate a single 3D thumbnail image. In general, thumbnail refers to a reduced image or a reduced still image. The thusly generated left image thumbnail and the right image thumbnail are displayed with a horizontal distance difference therebetween by a depth corresponding to the disparity between the left image and the right image on the screen, providing a stereoscopic space sense.

A left image and a right image required for implementing a 3D stereoscopic image is displayed on the stereoscopic display unit 152 by a stereoscopic processing unit 152a. The stereoscopic processing unit may receive the 3D image and extract the left image and the right image, or may receive the 2D image and change it into a left image and a right image.

Meanwhile, when the display unit 151 and a sensor (referred to as a 'touch sensor', hereinafter) for detecting a touch operation are overlaid in a layered manner to form a touch screen, the display unit 151 may function as both an input device and an output device. The touch sensor may have a form of a touch film, a touch sheet, a touch pad, and the like.

The touch sensor may be configured to convert pressure applied to a particular portion of the display unit 151 or a change in the capacitance or the like generated at a particular portion of the display unit 151 into an electrical input signal. The touch sensor may be configured to detect the pressure when a touch is applied, as well as the touched position and area.

When there is a touch input with respect to the touch sensor, a corresponding signal (signals) are transmitted to a touch controller. The touch controller processes the signals and transmits corresponding data to the controller 180. Accordingly, the controller 180 may recognize which portion of the display unit 151 has been touched.

With reference to FIG. 1, a proximity sensor 141 may be disposed within or near the touch screen. The proximity sensor 141 is a sensor for detecting the presence or absence of an object relative to a certain detection surface or an object that exists nearby by using the force of electromagnetism or infrared rays without a physical contact. Thus, the proximity sensor 141 has a considerably longer life span compared with a contact type sensor, and it can be utilized for various purposes.

Examples of the proximity sensor 141 may include a transmission type photoelectric sensor, a direct reflection type photoelectric sensor, a mirror-reflection type photoelectric sensor, an RF oscillation type proximity sensor, a capacitance type proximity sensor, a magnetic proximity sensor, an infrared proximity sensor, and the like. In case where the touch screen is the capacitance type, proximity of the pointer is detected by a change in electric field according to the proximity of the pointer. In this case, the touch screen (touch sensor) may be classified as a proximity sensor.

In the following description, for the sake of brevity, recognition of the pointer positioned to be close to the touch screen will be called a 'proximity touch', while recognition of actual contacting of the pointer on the touch screen will be called a 'contact touch'. In this case, when the pointer is in the state of the proximity touch, it means that the pointer is positioned to correspond vertically to the touch screen.

By employing the proximity sensor 141, a proximity touch and a proximity touch pattern (e.g., a proximity touch distance, a proximity touch speed, a proximity touch time, a proximity touch position, a proximity touch movement state, or the like) can be detected, and information corresponding to the detected proximity touch operation and the proximity touch pattern can be outputted to the touch screen.

When a touch sensor is overlaid on the stereoscopic display unit 152 in a layered manner, or when the stereoscopic display unit and a 3D sensor sensing a touch operation are combined, the stereoscopic display unit 152 may also be used as a 3D input device.

As examples of the 3D sensor, the sensing unit 140 may include a proximity sensor 141, a stereoscopic touch sensing unit 142, an ultrasonic sensing unit 143, and a camera sensing unit 144.

The proximity sensor 141 detects the distance between a sensing object (e.g., the user's finger or a stylus) applying a touch by using the force of electromagnetism or infrared rays without a mechanical contact and a detect surface. By using the distance, the terminal recognizes which portion of a stereoscopic image has been touched. In particular, when the touch screen is an electrostatic touch screen, the degree of proximity of the sensing object is detected based on a change of an electric field according to proximity of the sensing object, and a touch to the 3D image is recognized by using the degree of proximity.

The stereoscopic touch sensing unit 142 is configured to detect the strength or duration of a touch applied to the touch screen. For example, the stereoscopic touch sensing unit 142 senses pressure applying a touch, and the applied pressure is strong, the stereoscopic touch sensing unit 142 recognizes the touch as a touch with respect to an object positioned to be farther from the touch screen toward the interior of the terminal.

The ultrasonic sensing unit 143 is configured to recognize position information of the sensing object by using ultrasonic waves.

The ultrasonic sensing unit 143 may include, for example, an optical sensor and a plurality of ultrasonic sensors. The optical sensor is configured to sense light, and the ultrasonic sensors may be configured to sense ultrasonic waves. Since light is very faster than ultrasonic waves, light reaches the optical sensor very earlier than ultrasonic waves reach the ultrasonic sensors. Thus, based on light as a reference signal, a position of a wave generation source may be calculated by using a time difference between a time at which light reaches the optical sensor and a time at which ultrasonic waves reach the ultrasonic sensors.

The camera sensing unit 144 includes at least one of a camera, a photo sensor, and a laser sensor.

For example, the camera and the laser sensor may be combined to detect a touch of the sensing object with respect to a 3D stereoscopic image. When distance information detected by a laser sensor is added to a 2D image captured by the camera, 3D information can be obtained.

In another example, a photo sensor may be laminated on the display device. The photo sensor is configured to scan a movement of the sensing object in proximity to the touch screen. In detail, the photo sensor includes photo diodes and transistors at rows and columns to scan content mounted on the photo sensor by using an electrical signal changing according to the quantity of applied light. Namely, the photo sensor calculates the coordinates of the sensing object according to variation of light to thus obtain position information of the sensing object.

The audio output module 153 may convert and output as sound audio data received from the wireless communication unit 110 or stored in the memory 160 in a call signal reception mode, a call mode, a record mode, a voice recognition mode, a broadcast reception mode, and the like. Also, the audio output module 153 may provide audible outputs related to a particular function performed by the mobile terminal 100 (e.g., a call signal reception sound, a message reception sound, etc.). The audio output module 153 may include a speaker, a buzzer, or other sound generating device.

The alarm unit 154 outputs a signal for informing about an occurrence of an event of the mobile terminal 100. Events generated in the mobile terminal may include call signal reception, message reception, key signal inputs, a touch input etc. In addition to video or audio signals, the alarm unit 154 may output signals in a different manner, for example, to inform about an occurrence of an event. The video or audio signals may be also outputted via the audio output module 153, so the display unit 151 and the audio output module 153 may be classified as parts of the alarm unit 154.

A haptic module 155 generates various tactile effects the user may feel. A typical example of the tactile effects generated by the haptic module 155 is vibration. The strength and pattern of the haptic module 155 can be controlled. For example, different vibrations may be combined to be outputted or sequentially outputted.

Besides vibration, the haptic module 155 may generate various other tactile effects such as an effect by stimulation such as a pin arrangement vertically moving with respect to a contact skin, a spray force or suction force of air through a jet orifice or a suction opening, a contact on the skin, a contact of an electrode, electrostatic force, etc., an effect by reproducing the sense of cold and warmth using an element that can absorb or generate heat.

The haptic module 155 may be implemented to allow the user to feel a tactile effect through a muscle sensation such as fingers or arm of the user, as well as transferring the tactile effect through a direct contact. Two or more haptic modules 155 may be provided according to the configuration of the mobile terminal 100.

The memory 160 may store software programs used for the processing and controlling operations performed by the controller 180, or may temporarily store data (e.g., a phonebook, messages, still images, video, etc.) that are inputted or outputted. In addition, the memory 160 may store data regarding various patterns of vibrations and audio signals outputted when a touch is inputted to the touch screen.

The memory 160 may include at least one type of storage medium including a Flash memory, a hard disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 160 over the Internet.

The interface unit 170 serves as an interface with every external device connected with the mobile terminal 100. For example, the external devices may transmit data to an external device, receives and transmits power to each element of the mobile terminal 100, or transmits internal data of the mobile terminal 100 to an external device. For example, the interface unit 170 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating the authority of using the mobile terminal 100 and may include a user identity module (UIM), a subscriber identity module (SIM) a universal subscriber identity module (USIM), and the like. In addition, the device having the identification module (referred to as 'identifying device', hereinafter) may take the form of a smart card. Accordingly, the identifying device may be connected with the terminal 100 via a port.

When the mobile terminal 100 is connected with an external cradle, the interface unit 170 may serve as a passage to allow power from the cradle to be supplied therethrough to the mobile terminal 100 or may serve as a passage to allow various command signals inputted by the user from the cradle to be transferred to the mobile terminal therethrough. Various command signals or power inputted from the cradle may operate as signals for recognizing that the mobile terminal is properly mounted on the cradle.

The controller 180 typically controls the general operations of the mobile terminal. For example, the controller 180 performs controlling and processing associated with voice calls, data communications, video calls, and the like. The controller 180 may include a multimedia module 181 for reproducing multimedia data. The multimedia module 181 may be configured within the controller 180 or may be configured to be separated from the controller 180.

The controller 180 may perform a pattern recognition processing to recognize a handwriting input or a picture drawing input performed on the touch screen as characters or images, respectively.

Also, when a state of the mobile terminal satisfies pre-set conditions, the controller 180 may execute a locked state for limiting an input of a control command of the user. Also, in the locked state, the controller 180 may control a locked screen displayed in the locked state on the basis of a touch input sensed through the display unit 151.

The power supply unit 190 receives external power or internal power and supplies appropriate power required for operating respective elements and components under the control of the controller 180.

Various embodiments described herein may be implemented in a computer-readable or its similar medium using, for example, software, hardware, or any combination thereof.

For hardware implementation, the embodiments described herein may be implemented by using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic units designed to perform the functions described herein. In some cases, such embodiments may be implemented by the controller 180 itself.

For software implementation, the embodiments such as procedures or functions described herein may be implemented by separate software modules. Each software module may perform one or more functions or operations described herein.

Software codes can be implemented by a software application written in any suitable programming language. The software codes may be stored in the memory 160 and executed by the controller 180.

Hereinafter, a communication system implementable through the mobile terminal 100 according to an embodiment of the present invention will be described.

Figure 2A:
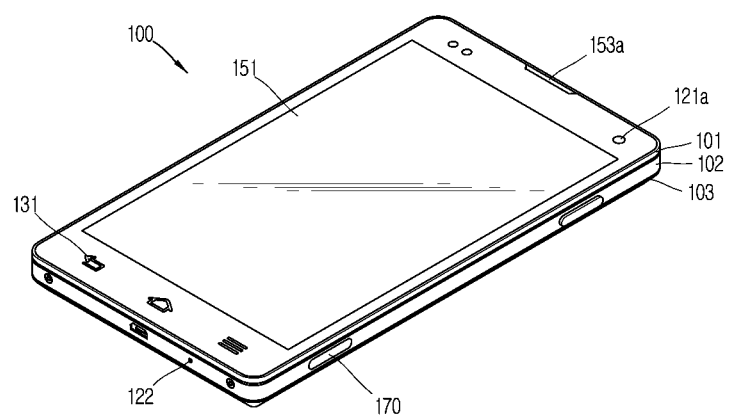
FIG. 2A is a front perspective view of a mobile terminal related to an exemplary embodiment of the present disclosure.

FIG. 2A is a front perspective view illustrating an example of the mobile terminal 100 associated with the present disclosure.

The mobile terminal 100 disclosed herein is provided with a bar-type terminal body. However, the present invention may not be limited to this, but also may be applicable to various structures such as watch type, clip type, glasses type or folder type, flip type, swing type, swivel type, or the like, in which two and more bodies are combined with each other in a relatively movable manner.

The terminal body includes a case (casing, housing, cover, etc.) forming the appearance of the terminal. In this embodiment, the case may be divided into a front case 101 and a rear case 102. Various electronic components are incorporated into a space formed between the front case 101 and the rear case 102. At least one middle case may be additionally disposed between the front case 101 and the rear case 102, and a battery cover 103 for covering the battery 191 may be detachably configured at the rear case 102.

The cases may be formed by injection-molding a synthetic resin or may be also formed of a metal, for example, stainless steel (STS), titanium (Ti), or the like.

A display unit 151, a first audio output module 153a, a first camera 121a, a first manipulating unit 131 and the like may be disposed on a front surface of the terminal body, and a microphone 122, an interface unit 170, a second manipulating unit 132 and the like may be provided on a lateral surface thereof.

The display unit 151 may be configured to display (output) information being processed in the mobile terminal 100. The display unit 151 may include at least one of a liquid crystal display (LCD), a thin film transistor-liquid crystal display (TFT-LCD), an organic light emitting diode (OLED) display, a flexible display, a 3-dimensional (3D) display, and an e-ink display.

The display unit 151 may include a touch sensing means to receive a control command by a touch method. When a touch is made to any one place on the display unit 151, the touch sensing means may be configured to sense this touch and enter the content corresponding to the touched place. The content entered by a touch method may be a text or numerical value, or a menu item capable of indication or designation in various modes.

The touch sensing means may be formed with transparency to allow visual information displayed on the display unit 151 to be seen, and may include a structure for enhancing the visibility of a touch screen at bright places.

Referring to FIG. 2A, the display unit 151 occupies a most portion of the front surface of the front case 101.

The first audio output module 153a and the first camera 121a are disposed in a region adjacent to one of both ends of the display unit 151, and the first manipulation input unit 131 and the microphone 122 are disposed in a region adjacent to the other end thereof. The second manipulation unit 132 (refer to FIG. 2B), the interface 170, and the like, may be disposed on a lateral surface of the terminal body.

The first audio output module 153a may be implemented in the form of a receiver for transferring voice sounds to the user's ear or a loud speaker for outputting various alarm sounds or multimedia reproduction sounds.

It may be configured such that the sounds generated from the first audio output module 153a are released along an assembly gap between the structural bodies. In this case, a hole independently formed to output audio sounds may not be seen or hidden in terms of appearance, thereby further simplifying the appearance of the mobile terminal 100. However, the present invention may not be limited to this, but a hole for releasing the sounds may be formed on the window.

The first camera 121a processes video frames such as still or moving images obtained by the image sensor in a video call mode or capture mode. The processed video frames may be displayed on the display unit 151.

The user input unit 130 is manipulated to receive a command for controlling the operation of the mobile terminal 100. The user input unit 130 may include a first and a second manipulation unit 131, 132. The first and the second manipulation unit 131, 132 may be commonly referred to as a manipulating portion, and any method may be employed if it is a tactile manner allowing the user to perform manipulation with a tactile feeling such as touch, push, scroll or the like.

In the present drawing, it is illustrated on the basis that the first manipulation unit 131 is a touch key, but the present disclosure may not be necessarily limited to this. For example, the first manipulation unit 131 may be configured with a mechanical key, or a combination of a touch key and a mechanical key.

The content received by the first and/or second manipulation units 131, 132 may be set in various ways. For example, the first manipulation unit 131 may be used to receive a command such as menu, home key, cancel, search, or the like, and the second manipulation unit 132 may receive a command, such as controlling a volume level being outputted from the first audio output module 153a, or switching into a touch recognition mode of the display unit 151.

The microphone 122 may be formed to receive the user's voice, other sounds, or the like. The microphone 122 may be provided at a plurality of places, and configured to receive stereo sounds.

The interface unit 170 serves as a path allowing the mobile terminal 100 to exchange data with external devices. For example, the interface unit 170 may be at least one of a connection terminal for connecting to an earphone in a wired or wireless manner, a port for near field communication (for example, an Infrared Data Association (IrDA) port, a Bluetooth port, a wireless LAN port, and the like), and a power supply terminal for supplying power to the mobile terminal 100. The interface unit 170 may be implemented in the form of a socket for accommodating an external card such as Subscriber Identification Module (SIM) or User Identity Module (UIM), and a memory card for information storage.

Figure 2B:
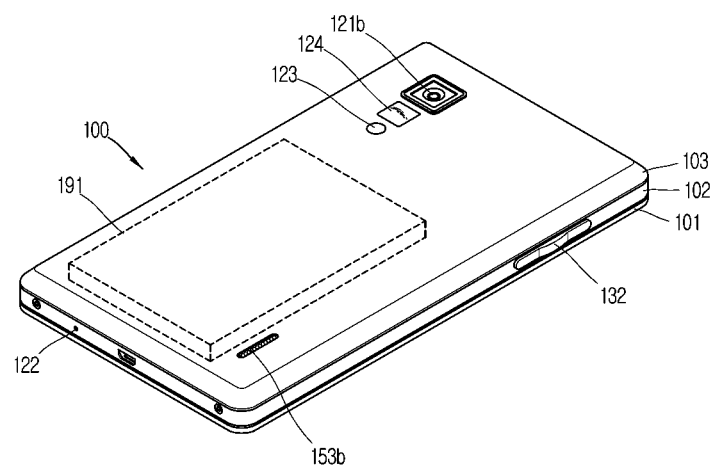
FIG. 2B is a rear perspective view illustrating an example of a mobile terminal related to an exemplary embodiment of the present disclosure.

FIG. 2B is a rear perspective view illustrating mobile terminal 100 illustrated in FIG. 2A.

Referring to FIG. 2B, a second camera 121b may be additionally mounted at a rear surface of the terminal body, namely, the rear case 102. The second camera 121b has an image capturing direction, which is substantially opposite to the direction of the first camera unit 121a (refer to FIG. 2A), and may have a different number of pixels from that of the first camera unit 121a.

For example, it is preferable that the first camera 121a has a relatively small number of pixels enough not to cause difficulty when the user captures his or her own face and sends it to the other party during a video call or the like, and the second camera 121b has a relatively large number of pixels since the user often captures a general object that is not sent immediately. The first and the second camera 121a, 121b may be provided in the terminal body in a rotatable and pop-up manner.

A flash 123 and a mirror 124 may be additionally disposed adjacent to the second camera 121b. The flash 123 illuminates light toward an object when capturing the object with the second camera 121b. The mirror 124 allows the user to look at his or her own face, or the like, in a reflected way when capturing himself or herself (in a self-portrait mode) by using the second camera 121b.

A second audio output module 153b may be additionally disposed at a rear surface of the terminal body. The second audio output module 153b together with the first audio output module 153a (refer to FIG. 2A) can implement a stereo function, and may be also used to implement a speaker phone mode during a phone call.

An antenna (not shown) for receiving broadcast signals may be additionally disposed at a lateral surface of the terminal body in addition to an antenna for making a phone call or the like. The antenna constituting part of the broadcast receiving module 111 (refer to FIG. 1) may be provided in the terminal body in a retractable manner.

A power supply unit 190 (refer to FIG. 1) for supplying power to the mobile terminal 100 may be mounted on the terminal body. The power supply unit 190 may be incorporated into the terminal body, or may include a battery 191 configured in a detachable manner on the outside of the terminal body. According to the drawing, it is illustrated that the battery cover 103 is combined with the rear case 102 to cover the battery 191, thereby restricting the battery 191 from being released and protecting the battery 191 from external shocks and foreign substances.

Hereinafter, a connector formed to electrically connect a printed circuit board (PCB) and a flexible printed circuit board (FPCB) within the mobile terminal 100 and the mobile terminal including the connector will be described.

Figure 3:
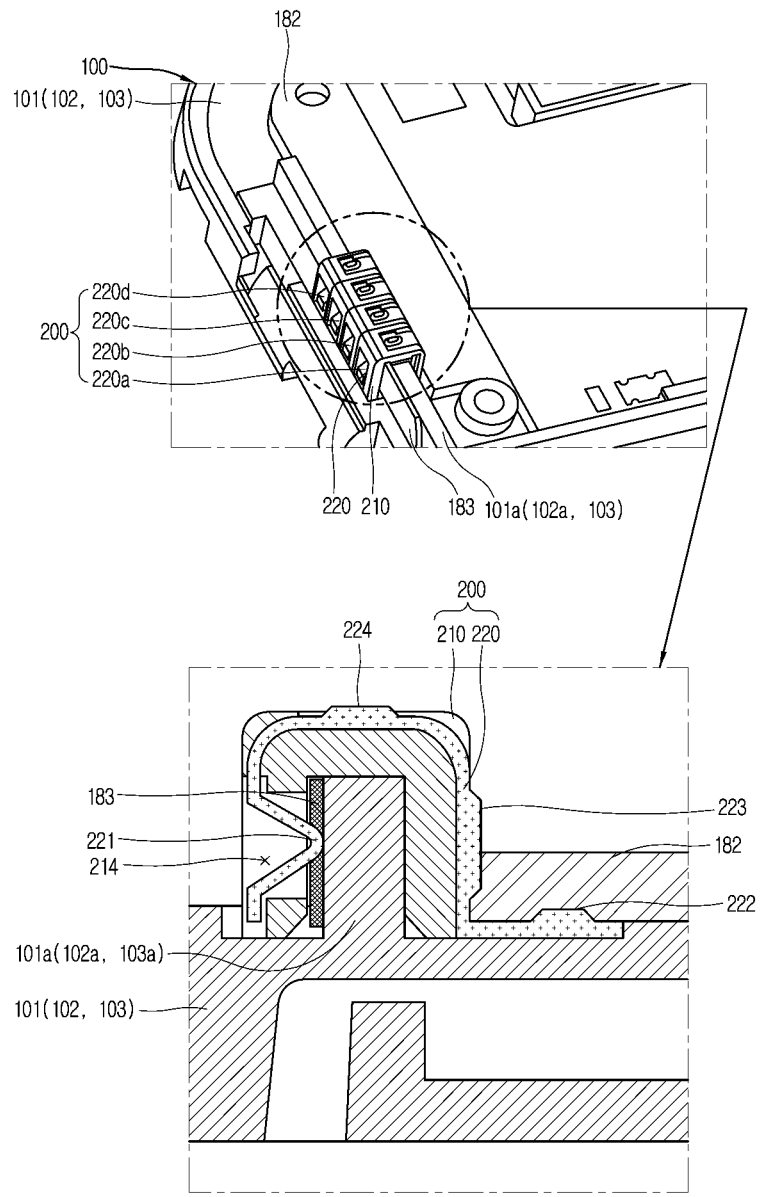
FIG. 3 is a partial perspective view and an enlarged cross-sectional view illustrating an internal structure of a mobile terminal in which a connector module is installed.

FIG. 3 is a partial perspective view and an enlarged cross-sectional view illustrating an internal structure of the mobile terminal 100 in which a connector module 200 is installed.

Cases 101, 102, and 103 form at least a portion of a terminal body and include ribs 101a, 102a, and 103a, respectively, formed to protrude within the terminal body. The cases 101, 102, and 103 may be at least one of a front case 101, a middle case 102, and a rear case 103.

The ribs 101a, 102a, and 103a are formed in the cases 101, 102, and 103, respectively. Hereinafter, similar reference numerals are used for the ribs 101a, 102a, and 103a and the cases 101, 102, and 103. That is, reference numeral of the rib 101a formed in the front case 101 is 101a, reference numeral of the rib 102a formed in the middle case 102 is 102a, and reference numeral of the rib 103a formed in the rear case 103 is 103a.

The ribs 101a, 102a, and 103a form boundaries between regions in which components such as a PCB 182, an antenna (not shown), a battery (not shown), and the like, are mounted. The ribs 101a, 102a, and 103a support the components mounted within the terminal body such that the components are prevented from being released from positions thereof.

The PCB 182 is installed within the terminal body 182 and electrically connected to other electronic components. The PCB 182 is disposed to be adjacent to the ribs 101a, 102a, and 103a.

The FPCB 183 may be disposed to be supported by at least one side walls of the ribs 101a, 102a, and 103a. The FPCB 183 may be fixed to the ribs 101a, 102a, and 103a by an adhesive tape. The FPCB 183 is electrically connected to the PCB 182. Unlike the PCB 182, the FPCB 183 has flexibility so the FPCB 183 may extend, through structures within the terminal body, to a position where the FPCB 183 is in contact with the electronic components. Accordingly, the FPCB 183 may electrically connect the electronic components or external devices to the PCB 182. The external devices are connected to the mobile terminal 100 through the interface unit 170 (please refer to FIGS. 1 through 2B).

As illustrated in FIG. 3, the PCB 182 and the FPCB 183 may be disposed in different regions demarcated by the ribs 101a, 102a, and 103a.

The connector module 200 is installed within the terminal body and coupled to the ribs 101a, 102a, and 103a. The connector module 200 is formed as a plurality of connectors 200a, 200b, 200c, and 200d having the same shape and disposed to be adjacent to each other are coupled. The connector module 200 is provided to electrically connect the PCB 182 and the FPCB 183, and each of the connectors 200a, 200b, 200c, and 200d includes a housing 210 and a terminal 220.

The housing 210 is provided to correspond to the ribs 101a, 102a, and 103a formed to protrude within the terminal body and directly coupled to the ribs 101a, 102a, and 103a. The housing 210 may be formed of an insulating material.

The terminal 220 is coupled to the housing 210 and is in contact with the PCB 182 and the FPCB 183 to electrically connect the PCB 182 and the FPCB 183.

Referring to FIG. 3 illustrating the enlarged partial cross-sectional view of the portion where the connector module 200 is coupled to the ribs 101a, 102a, and 103a, the FPCB 183 is disposed between the ribs 101a, 102a, and 103a and the housing 210, and the housing 210 covers the ribs 101a, 102a, and 103a.

The terminal 220 includes a plurality of contact portions 221, 222, 223, and 224.

The first contact portion 221 is in contact with the FPCB 183. The housing 210 includes a through hole 214 facing the FPCB 183, and the first contact portion 221 is provided to be inserted in the through hole 214. The first contact portion 221 is in contact with the FPCB 183 through the through hole 214. At least a portion of the first contact portion 221 protrudes from the through hole 214 and presses the FPCB 183 to tightly attach the FPCB 183 to the ribs 101a, 102a, and 103a.

The second contact portion 222 and the fourth contact portion 224 are bent and extend from the first contact portion 221.

A portion of the terminal 220 extends outwardly from the housing 210 so as to protrude outwardly from the housing 210. The second contact portion 222 protrudes from a portion of the terminal 220 extending outwardly from the housing 210 so as to be in contact with the PCB 182. The second contact portion 222 may be in contact with any one of a front surface and a rear surface of the PCB 182.

The third contact portion 223 is formed between the first contact portion 221 and the second contact portion 222. The third contact portion 223 is in contact with the PCB 182 in a position different from that of the second contact portion 222. In the terminal 200, a portion in which the third contact portion 223 is formed may be substantially perpendicular to a portion in which the second contact portion 222 is formed. Like the second contact portion 222, the third contact portion 223 may protrude from the terminal 220 and may be in contact with a side surface of the PCB 182.

The second contact portion 222 and the third contact portion 223 are pressed by the PCB 182, and thus, electrical disconnection thereof with the PCB 182 may be prevented. Since the PCB 182 are in contact with the two contact portions 222 and 223 so as to be electrically connected with the terminal 220, even though an electrical connection between any one contact portion (for example, 222) and the PCB 182 is cut off, an electrical connection may be maintained by another contact portion (for example, 223). Thus, even though an impact is applied to the mobile terminal 100 from the outside, such as a drop of the mobile terminal 100, or the like, an electrical connection between the PCB 182 and the FPCB 183 may be maintained.

The fourth contact portion 224 may be formed in a portion covering the ribs 101a, 102a, and 103a, in order to have a step with respect to the first contact portion 221 and the second contact portion 222. The portion in which the fourth contact portion 224 is formed may be substantially parallel to the portion in which the second contact portion 222 is formed. The fourth contact portion 224 may be connected to electronic components (not shown) disposed in a height different from that of the PCB 182. Here, the electronic component may be a PCB (not shown) different from the PCB 182. Thus, the connector module 200 may electrically connect the different PCB or the electronic components to the PCB 182.

The FPCB 183 may be electrically connected to the key buttons 132a, 132b, and 132c (please refer to FIGS. 6A and 6B) disposed on a side surface of the terminal body. The FPCB 183 may extend along the ribs 101a, 102a, and 103a so as to come into contact with switches 133a, 133b, 133c (please refer to FIGS. 6A and 6B) corresponding to key buttons 132a, 132b, and 132c. This structure may enhance durability of the terminal, compared with a related structure in which the PCB 182 and the key buttons 132a, 132b, and 132c are electrically connected by using a pin. The related art structure using a pin may have a problem in that the pin may be easily deformed or may be easily released from the position where the pin is to be present. In contrast, in an exemplary embodiment of the present disclosure, since the terminal 220 is coupled to the housing 210, the connectors 200a, 200b, 200c, and 200d proposed in an exemplary embodiment of the present disclosure may be prevented from being deformed, and also, since the connectors 200a, 200b, 200c, and 200d are pressed by the PCB 182, the connectors 200a, 200b, 200c, and 200d are not easily released from the ribs 101a, 102a, and 103a.

The related art structure using a pin is required to have a height equal to about 3.0 mm, but the connectors 200a, 200b, 200c, and 200d proposed in the present embodiment may be coupled to the ribs 101a, 102a, and 103a when there is a space having a height equal to about 2.88 mm. The height of the connectors 200a, 200b, 200c, and 200d may determine a thickness of the mobile terminal 100, and thus, the connectors 200a, 200b, 200c, and 200d proposed in an exemplary embodiment of the present disclosure may reduce the thickness of the mobile terminal 100, compared with the related art structure using a pin.

Also, a structure in which the FPCB 183 is directly mounted on the PCB 182 has a problem of reducing an available mounting area of the PCB 182 and has a limitation in reducing the thickness of the mobile terminal. In contrast, since the connectors 200a, 200b, 200c, and 200d proposed in an exemplary embodiment of the present disclosure include the third contact portion 223 in contact with a side surface of the PCB 182, the problem of reducing an available mounting area does not arise.

Hereinafter, the connector 200a forming the connector module 200 will be described with reference to FIG. 4.

Figure 4:
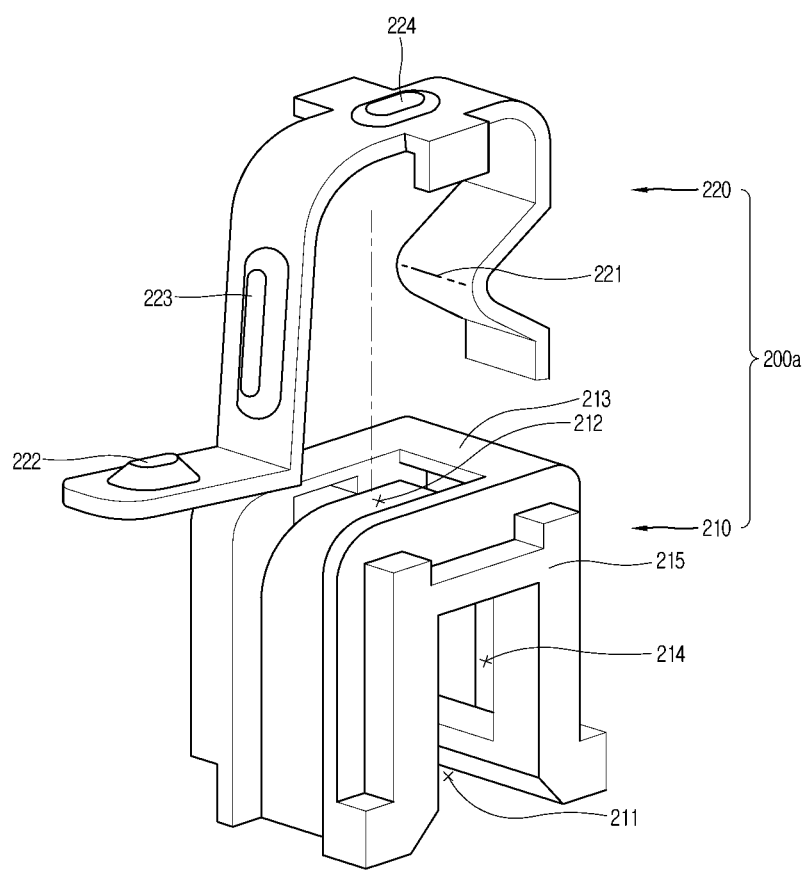
FIG. 4 is an exploded perspective view of a connector installed within a terminal body.

FIG. 4 is an exploded perspective view of the connector 200a installed within the terminal body.

The connector 200a includes the housing 210 and the terminal 220, and the housing 210 and the terminal 220 are coupled to form the connector 200a.

The housing 210 includes an accommodation portion 211 covering the ribs 101a, 102a, and 103a and coupled with the ribs 101a, 102a, and 103a (please refer to FIG. 3). The accommodation portion 211 is provided to correspond to the ribs 101a, 102a, and 103a to which the connector 200a is to be coupled, and the ribs 101a, 102a, and 103a and the FPCB 183 (please refer to FIG. 3) supported by the ribs 101a, 102a, and 103a are accommodated in the accommodation portion 211.

The housing 210 includes an installation portion 212 on which the terminal 220 is installed. The installation portion 212 has a width corresponding to the terminal 220, and forms a step with the peripheral portion in order to prevent the terminal 220 from being released therefrom. The shape of the installation portion 212 forming a step with the peripheral portion may prevent arbitrary movement of the terminal 220 installed in the installation portion 212.

The housing 210 includes a cover portion 213 covering at least a portion of the terminal 220 in order to prevent the terminal 220 installed in the installation portion 212 from being released. When the terminal 220 is installed in the installation portion 212, the cover portion 213 covers the terminal 220, and thus, the terminal 220 may be prevented from being released in a direction opposite to the direction in which the terminal 220 has been coupled to the housing 210. a direction in which the cover portion 213 limits movement of the terminal 220 and a direction in which the step of the installation portion 212 limits movement of the terminal 220 are substantially different. Thus, the step and the cover portion 213 prevent the terminal 220 from being released from the housing 210 together.

The housing 210 includes a through hole 214 facing the FPCB 183. The through hole 214 may face one side walls of the ribs 101a, 102a, and 103a. The through hole 214 provides a path allowing the terminal 220 installed in the installation portion 212 to be in contact with the FPCB 183 accommodated in the accommodation portion 211.

The terminal 220 is bent and extends in order to overcome the step formed by the ribs 101a, 102a, and 103a and electrically connect the PCB 182 and the FPCB 183. The terminal 220 includes the first contact portion 221 to the fourth contact portion 224.

The first contact portion 221 is provided to be bent so as to be inserted in the through hole 214.

The second contact portion 222 extends from the first contact portion 221 and bent, and disposed in a portion formed to protrude from the housing 210.

The third contact portion 223 is substantially perpendicular to the second contact portion 222 and formed to face in a direction different from that of the second contact portion 222. The third contact portion 223 may be formed between the first contact portion 221 and the second contact portion 222.

The fourth contact portion 224 forms a step with the second contact portion 222 and is formed in a height substantially different from that of the second contact portion 222. The fourth contact portion 224 may be provided to protrude to a position higher than the peripheral portion forming the step with the installation portion 212.

A portion of the terminal 220 may be spaced apart from the installation portion 212 and pressed by the PCB 182 so as to be tightly attached to the installation portion 212. The portion of the terminal 220 spaced apart from the installation portion 212 may be the portion in which the third contact portion 223 is formed in FIG. 4. Accordingly, the connector 200a and the PCB 183 (please refer to FIG. 3) may maintain a stable connection.

The housing 210 and the terminal 220 may be coupled to form the connector 200a, and a plurality of connectors 200a may be coupled to form the connector module 200. The housing 210 includes a coupling portion 215 to be coupled with other housing disposed to be adjacent thereto, and this will be described with reference to FIGS. 5A and 5B.

Figure 5A:
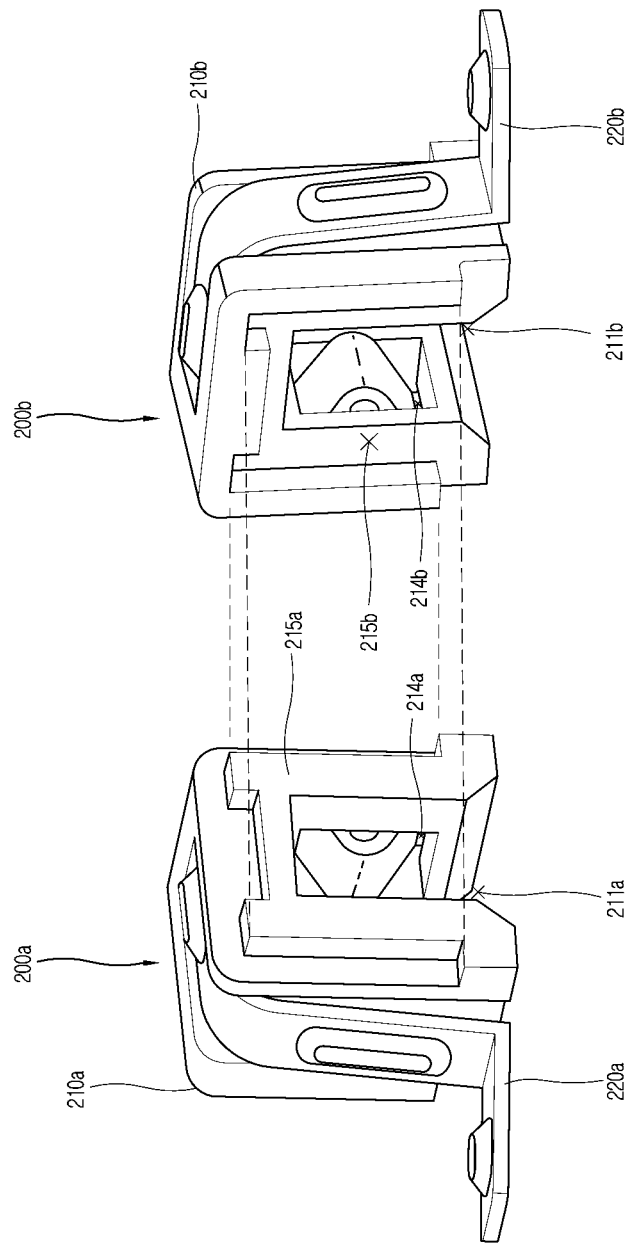
FIG. 5A is a conceptual view illustrating coupling of two connectors.
Figure 5B:
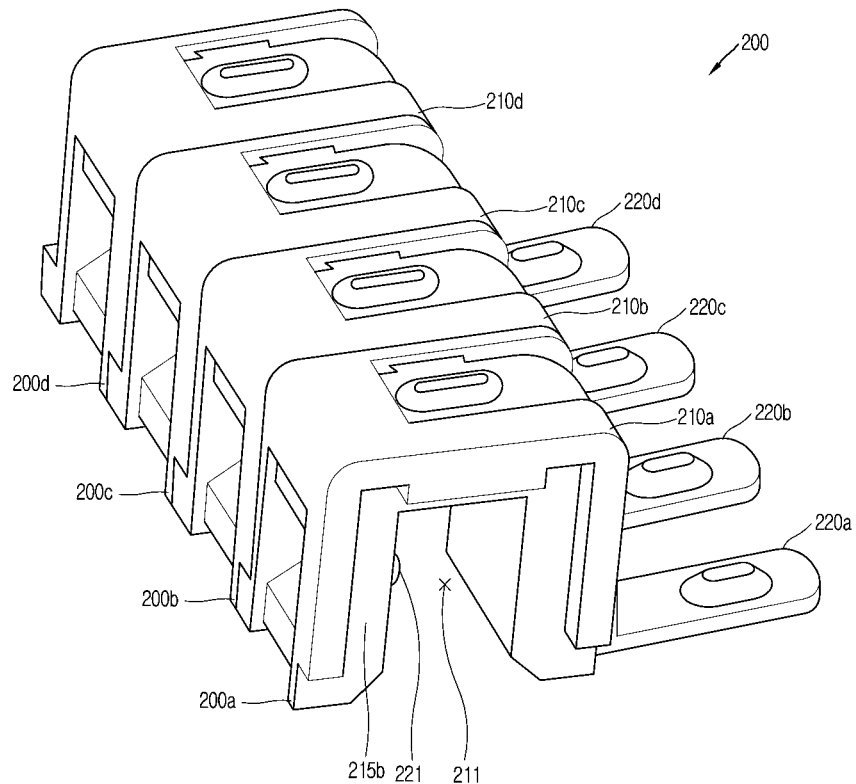
FIG. 5B is a perspective view of a connector module formed as a plurality of connectors are coupled.

FIG. 5A is a conceptual view illustrating coupling of two connectors 200a and 200b and FIG. 5B is a perspective view of the connector module 200 formed as a plurality of connectors 200a, 200b, 200c, and 200d are coupled.

Referring to FIG. 5A, the housings 210a and 210b of the connectors 200a and 200b include a coupling recess 215b provided on one side thereof so as to be coupled with other housings 210b and 210b, respectively, and include a coupling protrusion 215a provided on the other side thereof such that the coupling protrusion 215a corresponds to the coupling recess 215b, respectively.

The two connectors 200a and 200b may be coupled as the coupling protrusion 215b is inserted into the coupling recess 215b.

In FIG. 5B, referring to any one connector 200b among the connectors 200a, 200b, 200c, and 200d forming the connector module 200, the housing 210b is coupled to the housing 210a including a coupling protrusion portion 215a corresponding to a coupling recess 215b on one side and coupled to the housing 210c having a coupling recess 215c coupled to the coupling protrusion portion 215b on the other side. Accordingly, the connectors 200a and 200c are coupled to both sides of the connector 200b, and the connectors 200a, 200b, 200c, and 200d form a single connector module 200.

Also, the plurality of connectors 200a, 200b, 200c, and 200d may selectively gather to form the connector module 200. The number of the connectors 200a, 200b, 200c, and 200d forming the connector module 200 may vary depending on the number of the terminals 220 required in the mobile terminal 100, and other connectors may be added continuously as necessary. Thus, the connectors 200a, 200b, 200c, and 200d proposed in an exemplary embodiment of the present disclosure provide expandability.

The connectors 200a, 200b, 200c, and 200d are disposed to be coupled to the ribs 101a, 102a, and 103a (please refer to FIG. 3) extending in one direction. The accommodation portions 211 of the connectors 200a, 200b, 200c, and 200d are disposed to be adjacent to each other, and a single accommodation portion 211 extending in the same direction as that of the ribs 101a, 102a, and 103a is provided to allow the ribs 101a, 102a, and 103a to be coupled thereto.

The connector module 200 formed as the connectors 200a, 200b, 200c, and 200d gather is coupled to the ribs 101a, 102a, and 103a, and as described above with reference to FIG. 3, the connector module 200 electrically connects the PCB 182 and the FPCB 183.

Hereinafter, a structure in which the connector module 200 proposed in an exemplary embodiment of the present disclosure electrically connects a switch connected to the FPCB 183 to the PCB 182 will be described with reference to FIGS. 6A and 6B.

Figure 6A:
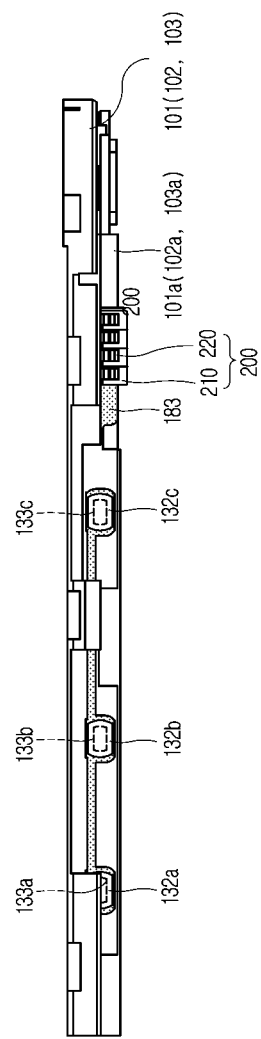
FIGS. 6A and 6B are side views illustrating an internal structure of a mobile terminal in which a connector module is installed.
Figure 6B:
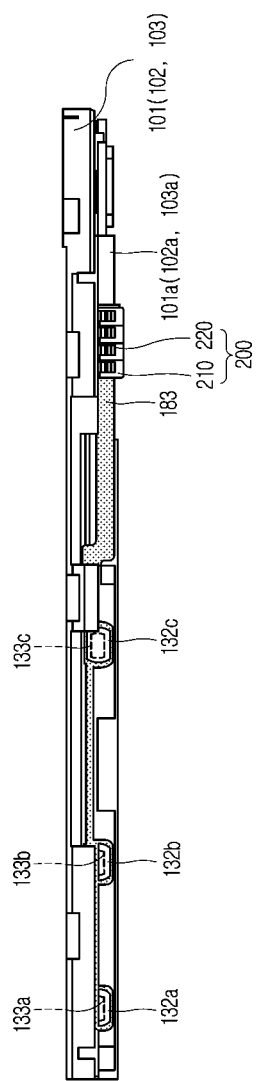

FIGS. 6A and 6B are side views illustrating an internal structure of the mobile terminal 100 in which the connector module 200 is installed.

The mobile terminal 100 includes the user input unit 130 (please refer to FIGS. 1 through 2B), and the user input unit 130 includes the key buttons 132a, 132b, and 132c disposed to be exposed to the outside of the terminal body. The key buttons 132a, 132b, and 132c may be disposed on a side surface of the terminal body. The switches 133a, 133b, and 133c may be disposed within the terminal body such that the switches 133a, 133b, and 133c corresponds to the key buttons 132a, 132b, and 132c, and electrically generates a signal according to a pressing operation of the key buttons 132a, 132b, and 132c. The FPCB 183 extends from the connector module 200 so as to be connected to the switches 133a, 133b, and 133c. Accordingly, the key buttons 132a, 132b, and 132c are electrically connected to the PCB 182 (please refer to FIG. 3) by the FPCB 183 and the connector module 200.

When FIGS. 6A and 6B are compared, both the connector module 200 illustrated in FIG. 6A and the connector module 200 illustrated in FIG. 6B are coupled to the ribs 101a, 102a, and 103a and electrically connected to the FPCB 183. Here, however, extended lengths of FPCBs 183 are different, and thus, positions in which the switches are disposed and the positions in which the key buttons 132a, 132b, and 132c are disposed are different.

In the related art mobile terminal, since the PCB and the key button disposed on the side surface of the terminal body are in contact with each other, the key button and the switch corresponding to the key button should be fixed. Thus, in the related art mobile terminal, the position of the key button cannot be freely selected.

In contrast, in the mobile terminal 100 including the connector 200 proposed in an exemplary embodiment of the present disclosure, since the switches 133a, 133b, and 133c and the connector 200 are connected by the FPCB 183 and the switches 133a, 133b, and 133c are electrically connected to the PCB 182 through the connector 200, the key buttons 132a, 132b, and 132c and the switches 133a, 133b, and 133c may be freely positioned according to a design desired in the terminal body by adjusting an extended length of the FPCB 183. Thus, in designing the mobile terminal 100, the position of the key buttons 132a, 132b, and 132c may be adjusted without having to change the position of the PCB 182 and selection of designs may widen. Also, regardless of position of the key buttons 132a, 132b, and 132c in the terminal body, the key buttons 132a, 132b, and 132c may be stably in contact with the PCB 182 by the connector 200.

Figure 7:
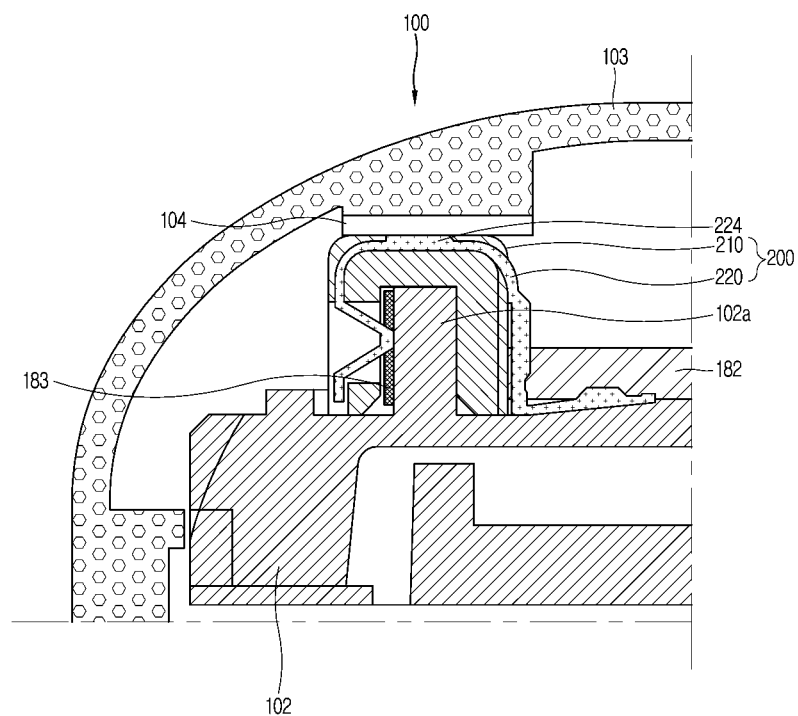
FIG. 7 is a partial cross-sectional view of a mobile terminal in which a connector forming a ground is installed.

FIG. 7 is a partial cross-sectional view of the mobile terminal 100 in which the connector 200 forming a ground is installed.

The rear case 103 forming the terminal body may be provided to cover the connector 200 in order to fix the connector 200 coupled to the rib 102a. Thus, since the connector 200 is limited in movement by the rib 102a and the rear case 103, the connector 200 may be prevented from being released from the rib 102a.

A conductive gasket 104 is disposed between the fourth contact portion 224 and the terminal body, and the fourth contact portion 224 is electrically connected to the conductive gasket 104 to form a ground. Electric shock damage (ESD) and electromagnetic interference (EMI) within the mobile terminal 100 may be improved by the formation of the ground.

The connector 200 may be coupled to the rib 102a formed in the middle case 102, and the conductive gasket 104 may be disposed to be in contact with the rear case 103. The fourth contact portion 224 of the connector 200 may press the conductive gasket 104 to be tightly attached to the rear case 103 to thus maintain an electrical contact state.

A frame for supporting an internal structure may be disposed within the mobile terminal 100, and the frame formed of a conductive metal may be used as the conductive gasket 104 forming a ground.

Unlike the related art mobile terminal in which the FPCB 183 connected to the key buttons 132a, 132b, and 132c (please refer to FIGS. 6A and 6B) disposed on the side surface of the terminal body serves to transfer only an input signal to the PCB 182, the connector 200 proposed in an exemplary embodiment of the present disclosure may form a ground using the fourth contact portion 224 in addition to transmission of an input signal. The contact portions 221, 222, and 223, other than the contact portion 224, may also form the ground.

Also, the related art mobile terminal separately requires a screw fastening structure electrically connecting a metal and the FPCB to form the ground. In contrast, in an exemplary embodiment of the present disclosure, the ground may be formed using the contact portion 224 provided in the connector 200, without any additional fastening structure.

Figure 8:
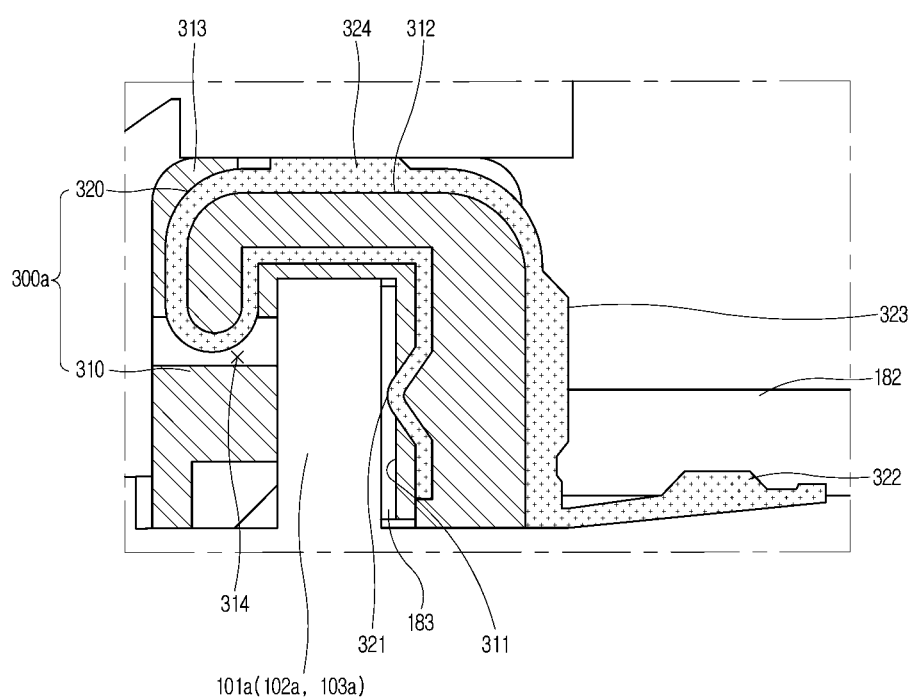
FIG. 8 is a partial cross-sectional view of a mobile terminal including a connector having a configuration different from that of the connector illustrated in FIG. 7.

FIG. 8 is a partial cross-sectional view of the mobile terminal 100 including a connector 300a having a configuration different from that of the connector 200 illustrated in FIG. 7.

A housing 310 is provided to cover ribs 101a, 102a, and 103a and coupled to the ribs 101a, 102a, and 103a. The housing 310 includes at least one through hole 314 provided in a portion facing the ribs 101a, 102a, and 103a.

A terminal 320 includes a plurality of contact portions 321, 322, 323, and 324 and is bent, like the terminal 220 of the connector 200a described above with reference to FIG. 3, but a bent shape and a position of the first contact portion 321 are different from those of the terminal 200 of the connector 200a.

The first contact portion 321 extends, passing through the through hole 314, along the ribs 101a, 102a, and 103a and comes into contact with an FPCB 183 disposed between the ribs 101a, 102a, and 103a and the housing 310. At least a portion of the first contact portion 321 is bent to protrude to press the FPCB 183 to the ribs 101a, 102a, and 103a.

The second contact portion 322, the third contact portion 323, and the fourth contact portion 324 are bent to extend from the first contact portion 321. The second contact portion 322 and the third contact portion 323 are in contact with the PCB 182 in different positions, and the fourth contact portion 324 may be in contact with the terminal body or the conductive gasket 104 (please refer to FIG. 7).

The ribs 101a, 102a, and 103a may demarcate regions in which components are mounted within the mobile terminal 100, and the connector 300a may electrically connect the PCB 182 and the FPCB 183 disposed in the same mounting area. Although the PCB 182 and the FPCB 183 disposed in the same mounting area, the PCB 182 and the FPCB 183 may be maintained in a stable contact state when electrically connected by the connector 300 300a, rather than being simply in direct contact with each other.

Figure 9:
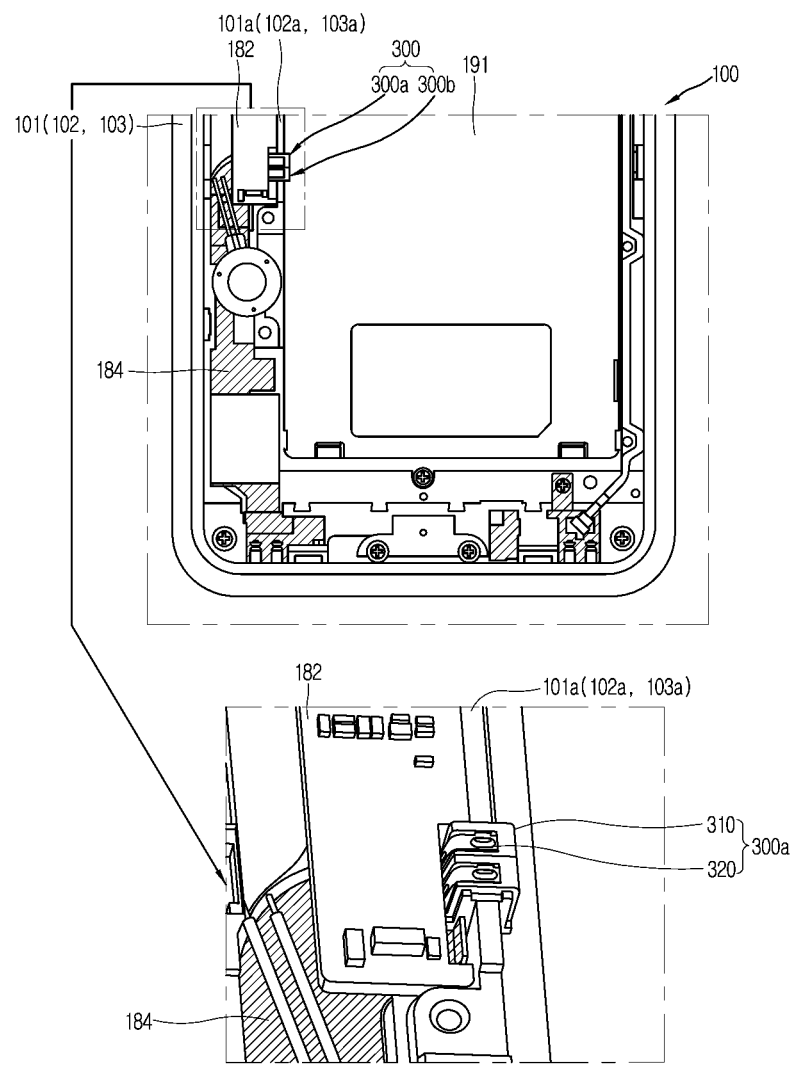
FIG. 9 is a conceptual view of a mobile terminal including the connector illustrated in FIG. 8.

FIG. 9 is a conceptual view of the mobile terminal 100 including the connector 300a illustrated in FIG. 8.

The mobile terminal 100 includes mounting areas demarcated by the ribs 101a, 102a, and 103a, and components of the terminal are installed in the mounting areas. For example, a battery 191 may be disposed in the largest mounting area of the terminal.

A rigid flexible printed circuit board (RFPCB) 184 is installed within a terminal body and at least a portion thereof may overlap the PCB 182. The RFPCB 184 is an integrated PCB having flexibility and reliability of surface mounting. At least a portion of the RFPCB 184 is supported by the ribs 101a, 102a, and 103a and may be fixed by the ribs 101a, 102a, and 103a and a connector module 300.

A plurality of connectors 300a and 300b are coupled to form the connector module 300, and the connector module 300 is coupled to the ribs 101a, 102a, and 103a. The connector module 300 may be in contact with the PCB 182 and the RFPCB 184 overlapping each other, and electrically connect the PCB 182 and the RFPCB 184.

The PCB 182 may press the terminal 320 and the RF PCB 182 simultaneously. Thus, the connector module 300 may maintain in an electrically connected state with the PCB 182 and the RF PCB 182 even though external impact is applied thereto.

The mobile terminal according to the embodiments of the present disclosure described above are not limited in its application, but the entirety or a portion of the embodiments may be selectively combined to be configured into various modifications.

The embodiments of the present invention propose a scheme of implementing a stable connection between the PCB and the FPCB, thereby being applied to various relevant industrial fields.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal comprising:
a rib configured to protrude within a terminal body; and
a connector installed in the rib and configured to electrically connect a printed circuit board (PCB) installed within the terminal body and a flexible printed circuit board (FPCB) supported by at least one side wall of the rib,
wherein the connector includes:
a housing formed of an insulating material and configured to include an accommodation portion covering the rib; and
a terminal installed in the housing and configured to include a first contact portion in contact with the FPCB accommodated within the accommodation portion and a second contact portion configured to be bent and extend from the first contact portion so as to be in contact with the PCB, and
wherein:
the housing includes an installation portion in which the terminal is installed; and
the installation portion has a width corresponding to the terminal, and has a step to prevent the terminal from being released.

2. The mobile terminal of claim 1, wherein the housing includes a cover portion covering at least a portion of the terminal installed in the installation portion in order to prevent the terminal from being released.

3. The mobile terminal of claim 1, wherein a portion of the terminal is pressed by the PCB so as to be tightly attached to the installation portion.

4. A mobile terminal comprising:
a rib configured to protrude within a terminal body; and
a connector installed in the rib and configured to electrically connect a printed circuit board (PCB) installed within the terminal body and a flexible printed circuit board (FPCB) supported by at least one side wall of the rib,
wherein the connector includes:
a housing formed of an insulating material and configured to include an accommodation portion covering the rib; and
a terminal installed in the housing and configured to include a first contact portion in contact with the FPCB accommodated within the accommodation portion and a second contact portion configured to be bent and extend from the first contact portion so as to be in contact with the PCB, and
wherein:
the housing includes a through hole facing the FPCB accommodated in the accommodation portion; and
the first contact portion is provided to be inserted in the through hole and is in contact with the FPCB through the through hole.

5. The mobile terminal of claim 4, wherein, in order to tightly attach the FPCB to the rib, at least a portion of the first contact portion protrudes from the through hole to the accommodation portion to press the FPCB.

6. The mobile terminal of claim 1, wherein:
the terminal protrudes outwardly from the housing; and
the second contact portion protrudes from an outwardly extending portion of the terminal so as to be in contact with the PCB disposed to be adjacent to the second contact portion.

7. A mobile terminal comprising:
a rib configured to protrude within a terminal body; and
a connector installed in the rib and configured to electrically connect a printed circuit board (PCB) installed within the terminal body and a flexible printed circuit board (FPCB) supported by at least one side wall of the rib,
wherein the connector includes:
a housing formed of an insulating material and configured to include an accommodation portion covering the rib; and
a terminal installed in the housing and configured to include a first contact portion in contact with the FPCB accommodated within the accommodation portion and a second contact portion configured to be bent and extend from the first contact portion so as to be in contact with the PCB, and
wherein the terminal includes a third contact portion formed between the first contact portion and the second contact portion and is in contact with the PCB in a position different from that of the second contact portion.

8. The mobile terminal of claim 7, wherein the second contact portion and the third contact portion are pressed by the PCB in order to prevent electrical disconnection with the PCB.

9. The mobile terminal of claim 7, wherein the third contact portion protrudes from the terminal and is in contact with a side surface of the PCB.

10. The mobile terminal of claim 7, wherein the terminal includes a fourth contact portion formed in a portion covering the rib so as to have a step with respect to the first contact portion and the second contact portion.

11. The mobile terminal of claim 10, wherein:
the housing includes an installation portion in which the terminal is installed;
the installation portion has a width corresponding to the terminal and has a step to prevent the terminal from being released therefrom; and
the fourth contact portion protrudes to be higher than the step of the installation portion.

12. The mobile terminal of claim 10, further comprising:
a conductive gasket configured to form a ground, disposed between the fourth contact portion and the terminal body, and electrically connected to the fourth contact portion.

13. The mobile terminal of claim 1, wherein:
the connector is coupled to at least one different connector to form a connector module; and
each housing of the connector module includes a coupling recess provided on one side thereof and a coupling protrusion provided on the other side thereof and corresponding to the coupling recess, so as to be coupled to a different housing disposed to be adjacent to each other.

14. The mobile terminal of claim 13, wherein the connectors forming the connector module are disposed side by side so as to be coupled to the rib extending in one direction.

15. The mobile terminal of claim 1, further comprising:
a key button disposed to be exposed outwardly from the terminal body; and
a switch disposed within the terminal body such that the switch corresponds to the key button, and configured to generate an electrical signal according to a pressing operation of the key button,
wherein the FPCB extends from the accommodation portion so as to be connected to the switch.

16. The mobile terminal of claim 15, wherein the connector electrically connects the switch and the PCB.

17. The mobile terminal of claim 1, further comprising:
a rigid flexible printed circuit board (RF PCB) accommodated in the accommodation portion and disposed to overlap the PCB in at least a portion thereof,
wherein the connector electrically connects the PCB and the RF PCB.

18. The mobile terminal of claim 1, wherein the terminal is formed of a conductive stainless steel material.

19. The mobile terminal of claim 1, wherein the terminal body is provided to cover the connector to fix the connector coupled to the rib.

* * * * *